US010529901B2

(12) United States Patent
Jung

(10) Patent No.: US 10,529,901 B2
(45) Date of Patent: Jan. 7, 2020

(54) LIGHT EMITTING DIODE PACKAGE AND METHOD FOR FABRICATING THE SAME

(71) Applicant: Seoul Semiconductor Co., Ltd., Ansan-si (KR)

(72) Inventor: Jung Hwa Jung, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/319,988

(22) Filed: Jun. 30, 2014

(65) Prior Publication Data
US 2014/0312366 A1 Oct. 23, 2014

Related U.S. Application Data

(63) Continuation of application No. 13/518,209, filed as application No. PCT/KR2010/008843 on Dec. 10, 2010, now abandoned.

(30) Foreign Application Priority Data

Dec. 21, 2009 (KR) .................. 10-2009-0127872

(51) Int. Cl.
H01L 33/50 (2010.01)
H01L 33/52 (2010.01)
(Continued)

(52) U.S. Cl.
CPC ........ H01L 33/505 (2013.01); H01L 25/0753 (2013.01); H01L 33/52 (2013.01)

(58) Field of Classification Search
CPC ......... H01L 2224/48091; H01L 33/005; H01L 33/52; H01L 33/54; H01L 33/505;
(Continued)

(56) References Cited

U.S. PATENT DOCUMENTS 7,445,354 B2 * 11/2008 Aoki .................... H01L 33/486
257/100
2002/0105266 A1 8/2002 Juestel et al.
(Continued)

FOREIGN PATENT DOCUMENTS

JP 2005-093601 4/2005
JP 2006-319238 11/2006
(Continued)

OTHER PUBLICATIONS

International Search Report dated Jun. 30, 2011 for International Application No. PCT/KR2010/008643.
(Continued)

Primary Examiner — Hoang-Quan T Ho
(74) Attorney, Agent, or Firm — H.C. Park & Associates, PLC

(57) ABSTRACT

An LED package allows a fluorescent material to be uniformly distributed around an LED chip on a base when a filling space inside a transparent wall surrounding the LED chip is filled with the fluorescent material. The LED package includes a base, at least one LED chip mounted on the base, a transparent wall formed on the base and having a filling space around the LED chip, and a fluorescent material, with which the filling space is filled to cover the LED chip.

19 Claims, 4 Drawing Sheets (a)

(b)

(c)

(51) Int. Cl.
  *H01L 33/54* (2010.01)
  *H01L 25/075* (2006.01)
(58) Field of Classification Search
  CPC ............... H01L 31/054; H01L 33/486; B29C 45/14655; G02B 6/0073
  USPC ....... 257/88, 98, 81, 99; 438/27; 362/249.01
  See application file for complete search history.

(56) References Cited

U.S. PATENT DOCUMENTS

| | | |
|---|---|---|
| 2004/0180459 A1 | 9/2004 | Hsu |
| 2005/0151147 A1 | 7/2005 | Izuno et al. |
| 2005/0231953 A1 | 10/2005 | Reeh et al. |
| 2006/0105485 A1* | 5/2006 | Basin ............... H01L 24/97 438/27 |
| 2006/0255716 A1 | 11/2006 | Tsutsumi et al. |
| 2007/0018191 A1* | 1/2007 | Roh ............... G02B 6/0073 257/99 |
| 2007/0205425 A1 | 9/2007 | Harada |
| 2008/0006839 A1* | 1/2008 | Lin ............... H01L 33/505 257/98 |
| 2008/0035942 A1 | 2/2008 | Kim et al. |
| 2008/0099770 A1 | 5/2008 | Mendendorp et al. |
| 2008/0298063 A1* | 12/2008 | Hayashi ............ B29C 45/14655 362/249.01 |
| 2009/0021140 A1* | 1/2009 | Takasu ............... H01L 33/46 313/502 |
| 2009/0097233 A1 | 4/2009 | Ooya et al. |
| 2009/0283785 A1 | 11/2009 | Kim |
| 2010/0118530 A1* | 5/2010 | Nagai ............... H01L 25/0753 362/235 |
| 2010/0181594 A1* | 7/2010 | Lin ............... H01L 21/486 257/99 |
| 2011/0084296 A1 | 4/2011 | Cheng |
| 2011/0127546 A1* | 6/2011 | Jaus ............... H01L 31/054 257/81 |
| 2011/0210354 A1* | 9/2011 | Ichikawa ............ B29C 45/0055 257/98 |
| 2013/0240935 A1 | 9/2013 | Jager et al. |

FOREIGN PATENT DOCUMENTS

| | | |
|---|---|---|
| KR | 10-2007-0067478 | 6/2007 |
| KR | 10-2008-0017527 | 2/2008 |

OTHER PUBLICATIONS

Non-Final Office Action dated Apr. 15, 2013 for U.S. Appl. No. 13/518,209.
Final Office Action dated Oct. 18, 2013 for U.S. Appl. No. 13/518,209.
Non-Final Office Action dated Jul. 11, 2014 for U.S. Appl. No. 13/518,209.
Chinese Office Action dated Jul. 3, 2014 in Chinese Application No. 201080057961.6.
Final Office Action dated Dec. 16, 2014, in U.S. Appl. No. 13/518,209.
Final Office Action dated Oct. 23, 2015, in U.S. Appl. No. 13/518,209.
Non Final Office Action dated May 13, 2015, in U.S. Appl. No. 13/518,209.
Non-Final Office Action dated Mar. 10, 2016 in U.S. Appl. No. 13/518,209.
Final Office Action dated Nov. 7, 2016, in U.S. Appl. No. 13/518,209.
Non Final Office Action dated Mar. 21, 2017, in U.S. Appl. No. 13/518,209.

* cited by examiner

[Figure 1]
Related art
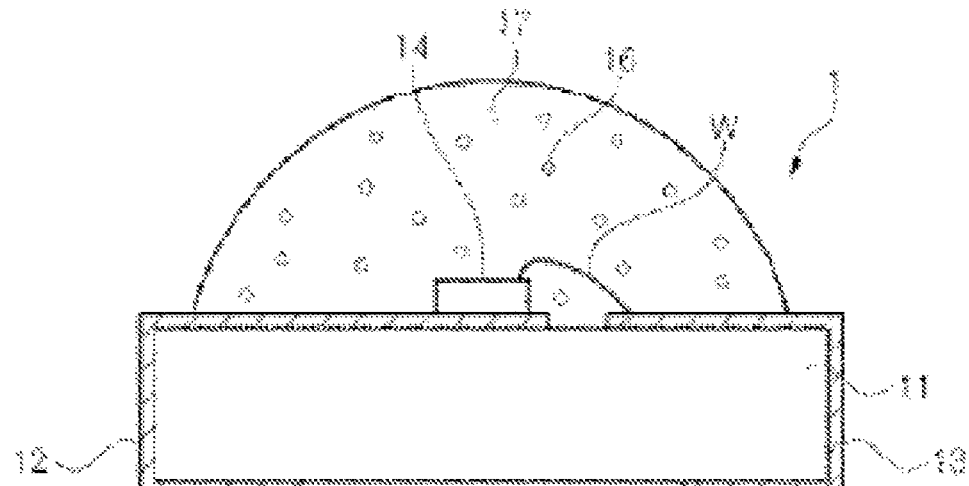
(a)
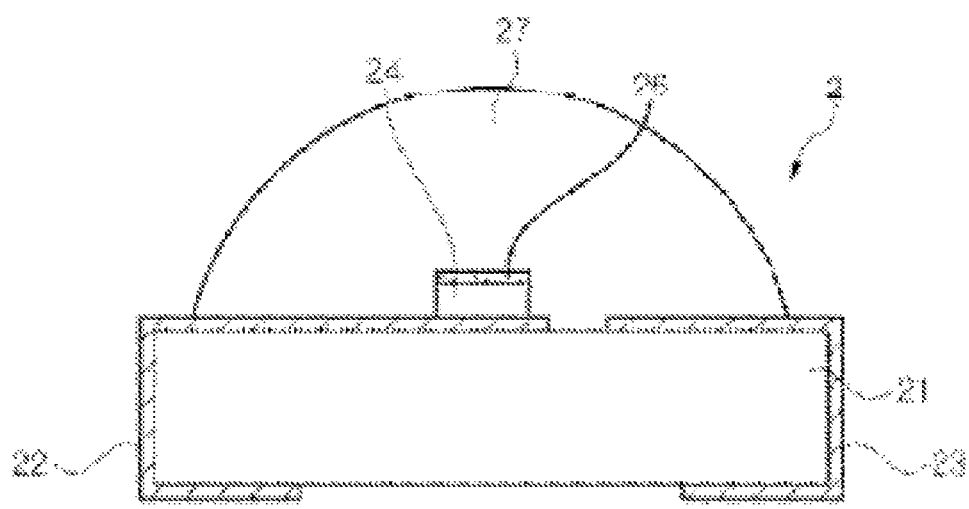
(b)

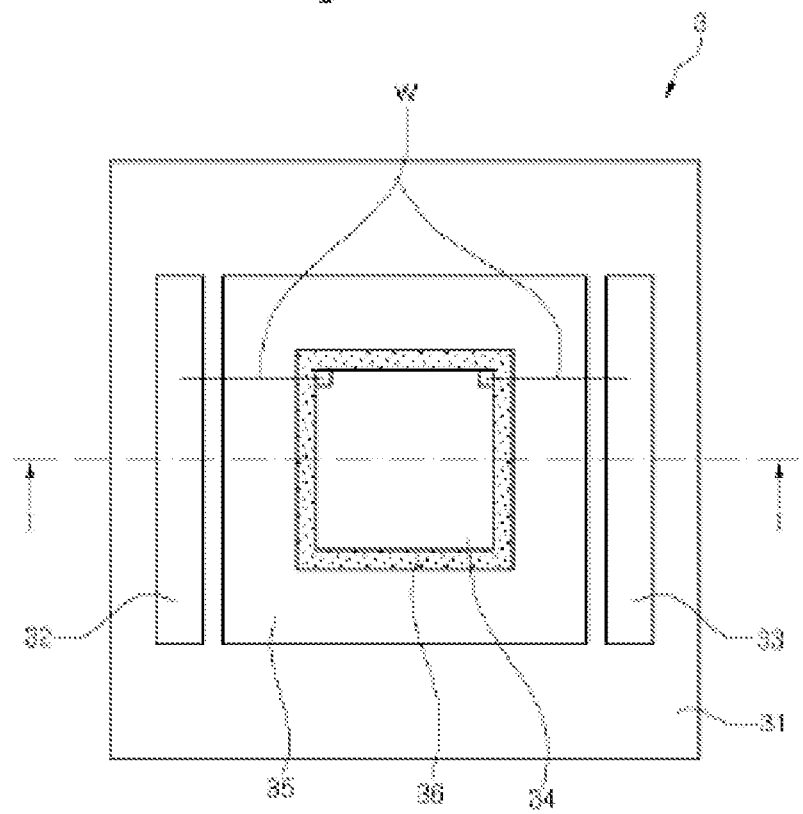
[Figure 2]
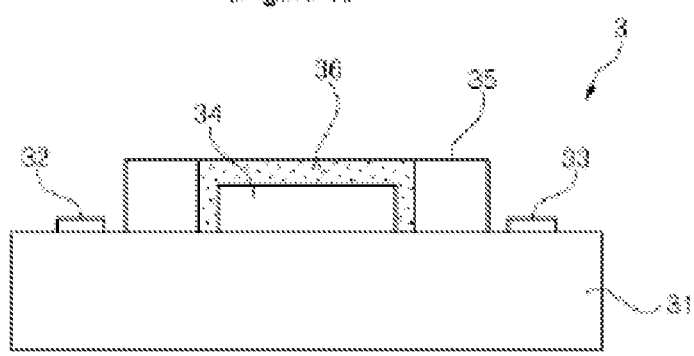
[Figure 3]

[Figure 4]
(a)
(b)
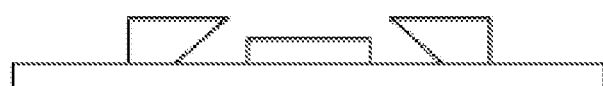
(c)
[Figure 5]
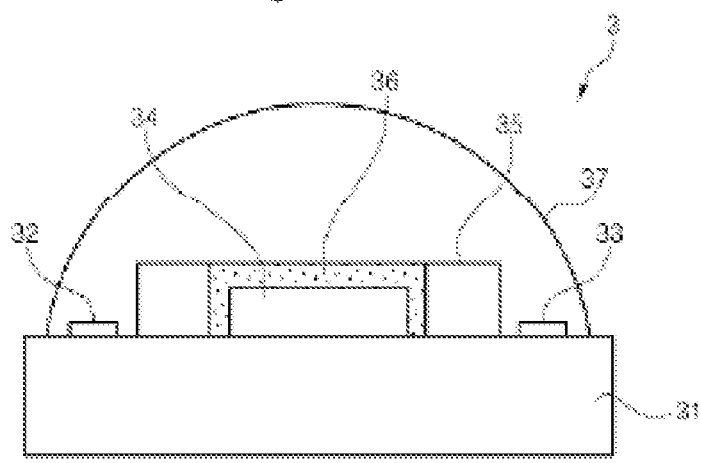
[Figure 6]
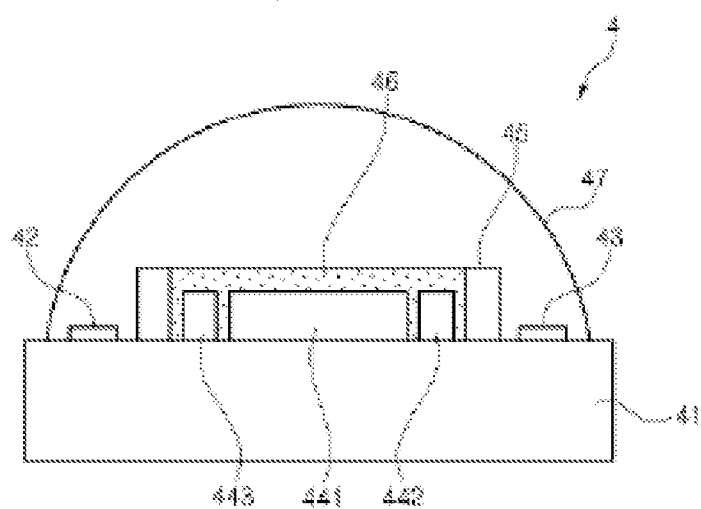

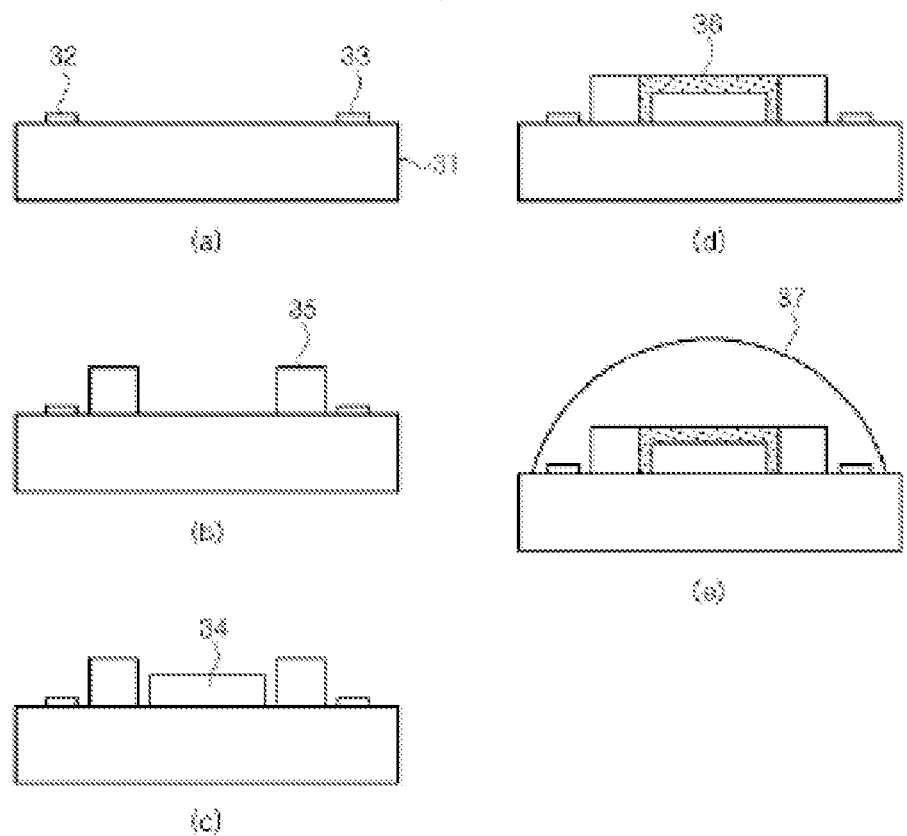

LIGHT EMITTING DIODE PACKAGE AND METHOD FOR FABRICATING THE SAME

CROSS-REFERENCE TO RELATED APPLICATIONS

This Application is a continuation of U.S. patent application Ser. No. 13/518,209, filed on Jun. 21, 2012, which is the National Stage Entry of International Application PCT/KR2010/008843, filed on Dec. 10, 2010, and claims priority from and the benefit of Korean Patent Application No. 10-2009-0127872, filed on Dec. 21, 2009, each of which is incorporated herein by reference for all purposes as if fully set forth herein.

BACKGROUND

Field

The present disclosure relates to a light emitting diode (LED) package and a method for fabricating the same.

Discussion of the Background

Typically, LED packages are used for a variety of applications, such as electronic billboards for displaying letters or figures, lighting fixtures for illuminating product showcases, and the like, by providing optical output of various colors including white, red, and blue, while consuming only a few dozen Watts.

Referring to FIG. 1(a), a conventional LED package includes a package body 11 having first and second electrodes 12, 13, and an LED chip 14 mounted on the first electrode 12. The LED chip 14 is mounted on the first electrode 12 and connected to the second electrode 13 via a bonding wire W. An encapsulation member 17 is formed to cover the LED chip 14 and the bonding wire W. The encapsulation member 17 has phosphors 16 dispersed therein for color conversion.

The LED package 1 may realize white light by a combination of the LED chip 14 and the phosphors 16. Specifically, phosphors, which emit yellow-green light or yellow light using some of the blue light emitted from the LED chip as an excitation source, are dispersed above the LED chip, so that white light can be realized by combination of the blue light emitted from the LED chip 14 and the yellow-green or yellow light emitted from the phosphors 16. That is, the LED package may realize white light through combination of the blue LED chip, which is composed of semiconductor components emitting light in a wavelength range of 430~480 nm, and the phosphors, which emit yellow light using the blue light as an excitation source.

However, in the LED package 1 shown in FIG. 1(a), non-uniform distribution of the phosphors 16 in the encapsulation member 17 can cause color deviation, due to a non-uniform optical path of the light emitted from the LED chip 14. As a result, when the LED package is applied to a secondary lens, the LED package exhibits poor optical efficiency.

A reduction in color deviation can be achieved by a process of forming a phosphor layer to a uniform thickness around the LED chip. However, this is a complicated process that should be performed under precise processing conditions. Therefore, to improve uniformity of phosphors and eliminate such problems, another conventional LED package 2 includes a package body 21, a first electrode 22, a second electrode 23, and a phosphor layer 26 formed on an upper surface of an LED chip 24, as shown in FIG. 1 (b).

With this configuration, the LED package 2 may have improved color uniformity of output light emitted from an encapsulation member 27 and through the phosphor layer 26, which has a constant thickness and is formed on the upper surface of the LED chip 24. However, since the phosphor layer 26 is disposed only on the upper surface of the LED chip 24, light emitted laterally from the LED chip 24 may result in color deviation.

SUMMARY

The present disclosure provides an LED package in which a fluorescent material is evenly distributed around an LED chip disposed on a base, by filling a space inside a wall surrounding the LED chip with the fluorescent material, and a method for fabricating the same.

In accordance with one aspect of the present disclosure, an LED package includes: a base; at least one LED chip mounted on the base; a transparent wall disposed on the base and extending around the LED chip; and a fluorescent material disposed inside of the transparent wall and covering upper and side surfaces of the LED chip.

In accordance with another aspect of the present disclosure, a method of fabricating an LED package includes: preparing a base; forming a transparent wall on the base to define a filling space open at an upper side thereof; mounting at least one LED chip on the base in the transparent wall; and filling the filling space with a fluorescent material to cover the LED chip.

In accordance with a further aspect of the present disclosure, an LED package includes: a base; at least one LED chip mounted on the base; a resin wall formed on the base and having a filling space around the LED chip; and a fluorescent material, with which the filling space is filled to cover the LED chip.

According to various embodiments, an LED package includes a fluorescent material that is uniformly distributed around an LED chip disposed on a base.

According to various embodiments, the transparent wall includes the same type of material as an encapsulation member, whereby the LED package can be advantageously fabricated without removing the transparent wall.

According to various embodiments, the distance between the transparent wall and the LED chip is equal to the distance between an upper end of the transparent wall and an upper end of the LED chip, whereby the fluorescent material may be distributed to a uniform thickness.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 1 is side-sectional views of conventional LED packages;

FIG. 2 is a top view of an LED package in accordance with an exemplary embodiment of the present disclosure;

FIG. 3 is a cross-sectional view taken along line I-I of FIG. 2;

FIG. 4 is side-sectional views of various examples of a wall of FIG. 3;

FIG. 5 is a side-sectional view of an LED package having an encapsulation member formed to cover the wall of FIG. 3;

FIG. 6 is a side-sectional view of an LED package in accordance with an exemplary embodiment of the present disclosure; and FIG. 7 is side-sectional views of a method for fabricating the LED packages of FIGS. 2 and 6.

DETAILED DESCRIPTION OF THE ILLUSTRATED EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 2 is a top view of an LED package 3, in accordance with an exemplary embodiment of the present disclosure. FIG. 3 is a cross-sectional view taken along line I-I of FIG. 2. FIG. 4 is side-sectional views of various examples of a wall of FIG. 3. FIG. 5 is a side-sectional view of an LED package having an encapsulation member formed to cover the entirety of a wall of FIG. 3.

Referring to FIGS. 2 and 3, the LED package 3 includes a base 31 and first and second electrodes 32, 33 disposed on the base 31. The base 31 may be a printed circuit board or a lead frame. Here, the printed circuit board may include a flat board supported by a ceramic or polyphthalamide (PPA) resin material. The LED package 3 may further include a reflector (not shown) disposed on the base to reflect light generated by the LED chip 34.

A metal pad (not shown) may be provided on a lower surface of the base 31, to be attached to other objects by, for example, surface mount technology (SMT). The first and second electrodes 32, 33 formed on the base 31 may be electrically connected to the metal pad. A wall 35 is disposed on the base 31 and is open at an upper side thereof. The wall 35 may at least partially define a filling space and may be transparent. The LED chip 34 is mounted inside the wall 35.

The wall 35 may be formed on the base by, for example, transfer molding. In this case, a mold (not shown) may be disposed on the base 31, in consideration of the size/shape of the LED chip 34, to make the distance between the wall 35 and the LED chip 34 equal to a difference between the height of the wall 35 and the height of the LED chip 34. The mold may be filled with a light-transmitting (transparent) resin, thereby forming the wall 35.

The wall 35 may be formed of glass, silicone, epoxy, or other suitable transparent resins. As shown in FIG. 4(a), the wall 35 may have an inner side surface that is perpendicular to the plane of the base, so that the fluorescent material may be formed to a uniform thickness. The wall 35 may be configured to correspond to the shape of any LED chip.

FIGS. 4 (b) and 4 (c) show inclined side surfaces of the wall 35. Further, since the wall 35 may have any shape so long as a suitable filling space is formed around the LED chip 34, the wall 35 may receive any LED chip.

The wall 35 may be made of the light-transmitting material. However, according to some embodiments, the wall 35 may be made of an opaque resin. If the wall 35 is opaque, the wall 35 may reflect light emitted from the LED chip 34, and an inner side surface(s) of the wall 35 may be slanted, for example, at an angle of 120 degrees.

The LED chip 34 is electrically connected to the first and second electrodes 32, 33 via, for example, two bonding wires (W). The filling space of the wall 35 is filled with a fluorescent material 36, so as to cover the LED chip 34. According to some embodiments, the fluorescent material 36 covers upper and side surfaces of the LED chip 34 and may completely cover the LED chip 34. Particularly, when the distance between the wall 35 and the LED chip 34 is equal to the difference in height between the wall 35 and the LED chip 34, as measured from the base 31, it is possible to form the fluorescent material 36 to a uniform thickness around the LED chip 34. The fluorescent material 36 may be composed of a light-transmitting resin and phosphors.

In addition or alternatively, the LED package may further include an encapsulation member 37, to protect the fluorescent material 36, which covers the LED chip 34 and the wall 35. The encapsulation member 37 is shown in full detail in FIG. 5.

The encapsulation member 37 may include epoxy resin, silicone resin, or the like, and may include the same type of transparent material as the wall 35. Accordingly, after the wall 35 is formed and the fluorescent material 36 is uniformly disposed on the LED chip 34, the encapsulation member 37 may be formed without removing the wall 35, so that the LED package may be easily fabricated.

In this embodiment, the encapsulation member 37 has a convex shape. However, it should be understood that the shape of the encapsulation member is not limited thereto and may be selected according to use of a light source.

With this configuration, the LED chip 34 in the LED package 3 receives electric current from the first and second electrodes 32, 33 on the base 31 and emits light, which in turn is emitted to the outside through a uniform color conversion path, thereby reducing color deviation.

FIG. 6 is a side-sectional view of an LED package 4 in accordance with an exemplary embodiment. The LED package 4 has a different number of LED chips than the LED package 3. Next, the different features of the LED package 4 will be described.

The LED package 4 includes first to third LED chips 441, 442, 443 mounted inside a wall 45 formed of a transparent material and disposed on a base 41. Although the LED package 4 is described as including three LED chips, any suitable number of LED chips may be mounted on the base.

A filling space is at least partially defined by the wall 45 such that a mounting surface on the base for mounting the first to third LED chips 441, 442, 443 has a larger area than in the LED package 3. Each of the first to third LED chips 441, 442, 443 is electrically connected to the first and second electrodes 42, 43, via three pairs of bonding wires (not shown). An encapsulation member 47 may be formed on the base, so as to completely cover the transparent wall.

An inner surface of the wall 45 may have the same shape as that of the first to third LED chips 441, 442, 443. Specifically, the distance between the inner surfaces of the wall 45 and the first to third LED chips 441, 442, 443, the distance between the first LED chip 441 and the second LED chip 442, the distance between the first LED chip 441 and the third LED chip 443, and the height difference between the wall 45 and the first to third LED chips 441, 442, 443 are set to define constant filling spaces therebetween. The filling spaces are filled with the fluorescent material 46. Consequently, the fluorescent material may have a uniform thickness over the first to third LED chips 441, 442, 443. Therefore, since light generated by the first to third LED chips 441, 442, 443 is emitted to the outside through a uniform color conversion path, it is possible to improve the quality of light by reducing color deviation.

Next, a method of fabricating an LED package having such configuration will be described with reference to FIG. 7. FIG. 7 shows side-sectional views of a method for fabricating the LED package of FIG. 2. Referring to FIG. 7, a base 31 is prepared as shown in FIG. 7(a). The base 31 may have first and second electrodes 32, 33 on an upper surface thereof and a metal pad (not shown) on a lower surface thereof.

Next, as shown in FIG. 7(b), a wall 35 is formed on the base 31. The wall 35 may be transparent. The wall 35 is formed between the first and second electrodes 32, 33 and may be formed on the base 31 by, for example, transfer molding. In this embodiment, an LED chip 34 having a rectangular shape is mounted on the base 31, and the wall 35 has an inner side surface that is perpendicular to the base. However, the inner side surface of the wall 35 is not limited thereto and may be modified according to the shape of the LED chip, to allow any shape of LED chip to be mounted inside the wall 35, so that a uniform layer may be formed in the LED chip. For example, the wall 35 may have an inclined inner side surface such that the distance between the wall 35 and the LED chip gradually increases going upwards or downwards.

Next, as shown in FIG. 7(c), an LED chip 34 is mounted inside the wall 35. In this case, the LED chip 34 is mounted such that the distance between the inner side surface of the wall 35 and the LED chip 34 is constant. Next, although not shown in the drawings, the LED chip 34 is electrically connected to the first and second electrodes 32, 33 on the base 31, via bonding wires (W). In this embodiment, two bonding wires (W) are used to electrically connect the LED chip 34 to the first and second electrodes 32, 33 on the base 31.

Next, as shown in FIG. 7(d), a fluorescent material 36 is supplied to a space at least partially defined by the wall 35, to cover upper and side surfaces of the LED chip 34. Here, the fluorescent material 36 may comprise a combination of at least one phosphor and a light-transmitting resin. The fluorescent material 36 is coated on the LED chip 34 at a uniform thickness, in accordance with the shape of the wall 35. After the fluorescent material 36 is supplied to cover the LED chip 34, the resultant may be cut to produce individual LED packages. Alternatively, the resultant may be subjected to a process as shown in FIG. 7(e), followed by cutting to produce individual LED packages.

Optionally, as shown in FIG. 7(e), an encapsulation member 37 may be formed on the base 31 to cover the wall 35 and the first and second electrodes 32, 33. The encapsulation member 37 may protect the LED chip 34, the wall 35, bonding wires (W), the first and second electrodes 32, 33, and the like.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode package, comprising:
   a base;
   an LED chip mounted on the base;
   an opaque wall disposed on the base and surrounding the LED chip, the opaque wall exposing the LED chip in a plan view; and
   a fluorescent material disposed on an upper surface of the LED chip,
   wherein the opaque wall surrounds at least one side part of the fluorescent material,
   wherein the opaque wall comprises a linearly inclined interior side surface that has a thickness gradually increases away from the base, and
   wherein a bottom surface of the LED chip and a bottom surface of the opaque wall contact a same layer.

2. The LED package of claim 1, wherein the fluorescent material extends to a side surface of the LED chip.

3. The LED package of claim 2, wherein the opaque wall defines the space where the fluorescent material disposed.

4. The LED package of claim 1, wherein the opaque wall surrounds the circumference of the LED chip and is configured to correspond to the shape of the LED chip.

5. The LED package of claim 1, wherein an outer surface of the opaque wall is perpendicular to the plane of the base.

6. The LED package of claim 1, wherein the fluorescent material has a consistent thickness on upper surface of the LED chip.

7. The LED package of claim 1, wherein a distance between the opaque wall and the LED chip is the same as the difference between the height of the opaque wall and the height of the LED chip, as measured from the base.

8. The LED package of claim 1, wherein an upper surface of the fluorescent material is flush with an upper surface of the opaque wall.

9. The LED package of claim 1, further comprising a plurality of the LED chips disposed inside of the opaque wall.

10. The LED package of claim 9, wherein the fluorescent material is disposed in an area between adjacent LED chips.

11. A light emitting diode package, comprising:
    a base;
    an LED chip mounted on the base;
    an opaque wall disposed on the base and surrounding the LED chip, the opaque wall comprising an opaque resin and exposing the LED chip in a plan view; and
    a fluorescent material disposed on an upper surface of the LED chip,
    wherein the opaque wall comprises an inclined interior surface,
    wherein the opaque wall has a greater thickness at an upper surface thereof than a lower surface thereof, and
    wherein a bottom surface of the LED chip and a bottom surface of the opaque wall contact a same layer.

12. The LED package of claim 11, wherein an upper surface of the fluorescent material is flush with an upper surface of the opaque wall.

13. The LED package of claim 11, wherein a resin comprising the fluorescent material is filled between the wall and the LED chip.

14. The LED package of claim 11, further comprising a plurality of the LED chips disposed inside of the wall.

15. The LED package of claim 14, wherein:
the fluorescent material is formed as a resin; and
the resin fills a gap between adjacent LED chips.

16. The LED package of claim 15, wherein the resin has an inclined outer side surface facing the interior surface of the wall.

17. The LED package of claim 1, wherein the opaque wall does not overlap the LED chip in a plan view.

18. The LED package of claim 11, wherein the opaque wall does not overlap the LED chip in a plan view.

19. A light emitting diode package, comprising:
a base;
an LED chip mounted on the base;
an opaque wall disposed on the base and surrounding the LED chip, the opaque wall exposing the LED chip in a plan view; and
a resin comprising a fluorescent material filled between the wall and the LED chip, the fluorescent material disposed on an upper surface of the LED chip,
wherein the opaque wall comprises an inclined interior surface,
wherein the opaque wall has a greater thickness at an upper surface thereof than a lower surface thereof, and
wherein a bottom surface of the LED chip and a bottom surface of the opaque wall contact a same layer.

\* \* \* \* \*